United States Patent [19]

Vlannes

[11] Patent Number: 5,004,673
[45] Date of Patent: Apr. 2, 1991

[54] METHOD OF MANUFACTURING SURFACE RELIEF PATTERNS OF VARIABLE CROSS-SECTIONAL GEOMETRY

[75] Inventor: Nickolas P. Vlannes, Troy, N.Y.

[73] Assignee: Environmental Research Institute of Michigan, Ann Arbor, Mich.

[21] Appl. No.: 449,644

[22] Filed: Dec. 12, 1989

Related U.S. Application Data

[63] Continuation of Ser. No. 40,055, Apr. 20, 1987, abandoned.

[51] Int. Cl.$^5$ .......................... G03C 5/00; B44C 1/00; G02B 5/18
[52] U.S. Cl. ........................................ 430/325; 430/30; 430/299; 430/313; 430/321; 430/323; 430/326; 430/327; 430/329; 350/162.21; 350/162.22; 350/162.23; 350/162.24; 427/38; 156/643; 156/659.1
[58] Field of Search ........... 350/162.21, 162.2, 162.22, 350/162.24, 162.23; 430/30, 320, 321, 322, 323, 324, 322, 329, 299, 325, 296, 313, 326; 427/38; 148/115, 187; 156/643, 659.1

[56] References Cited

U.S. PATENT DOCUMENTS

4,330,175  5/1982  Fujii et al. ...................... 350/162.22
4,530,736  7/1985  Mutter ................................ 430/321

FOREIGN PATENT DOCUMENTS

0037734  2/1985  Japan .................................. 430/314

OTHER PUBLICATIONS

T. Fujita, H. Nishihara and J. Koyama, "Blazed Gratings and Fresnel Lenses Fabricated by Electron-Beam Lithography", vol. 7, No. 12, pp. 578–580, Dec. 1982.
T. Shiono, K. Setsune, O. Yamazaki, and K. Wasa, "Computer-Controlled Electron-Beam Writing Systsem for Thin Micro-Optics", Journal of Vacuum Science and Technology B, vol. 5, No. 1, pp. 33–36, Jan.-/Feb. 1987.
T. Shiono, K. Setsune, O. Yamazaki, and K. Wasa, "Rectangular-Apertured Micro-Fresnel Lens Array Fabricated by Electron-Beam Lithography", Applied Optics, vol. 26, No. 3, pp. 587–591, Feb. 1, 1987.

*Primary Examiner*—Ellis P. Robinson
*Assistant Examiner*—Donald J. Loney
*Attorney, Agent, or Firm*—Krass & Young

[57] ABSTRACT

A method of manufacturing surface relief patterns of variable depth in solid materials is disclosed, which patterns, when seen in cross-section, are of variable geometry. After determining the properties of the desired surface relief pattern and of the material to be etched, the steps used in the method include: depositing a layer of measured thickness of photoresist material on the surface of the material to be etched; applying a selected amount of radiation to specific areas on the photoresist, thereby sensitizing the photoresist, so that the amount of radiation on the photoresist is a function of the depth of the desired surface relief pattern in the solid material at that point; chemically developing the photoresist material to remove the sensitized material in proportion to the exposure which it has received; and finally, etching the combined photoresist and substrate through reactive ion etching until portions of the photoresist material have been removed, thereby leaving the desired pattern etched in the substrate. As an additional step, the etched substrate may be coated with a metallic film with protective and optically desirable properties.

20 Claims, 2 Drawing Sheets

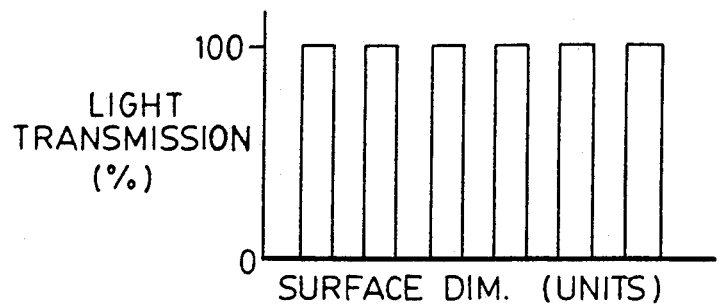
Fig. 1
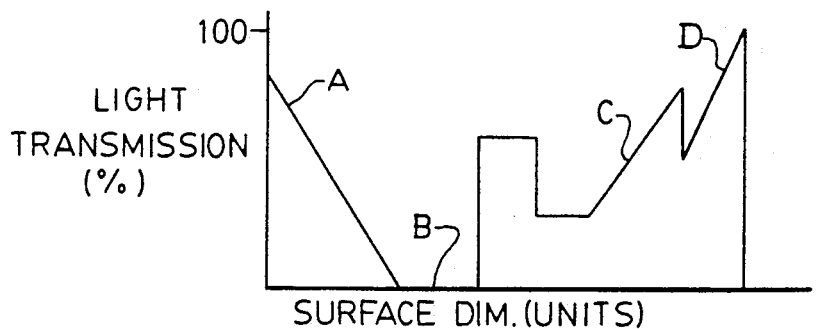
Fig. 2
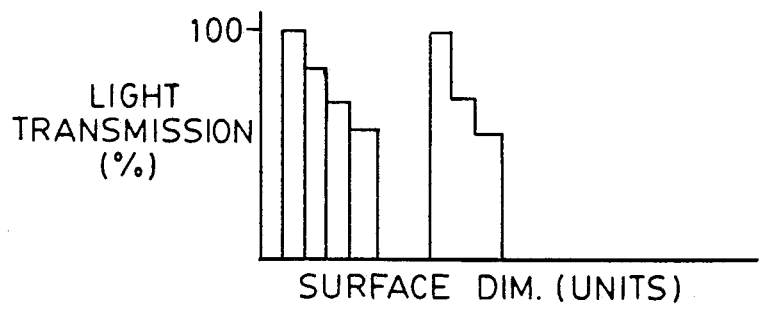
Fig. 3
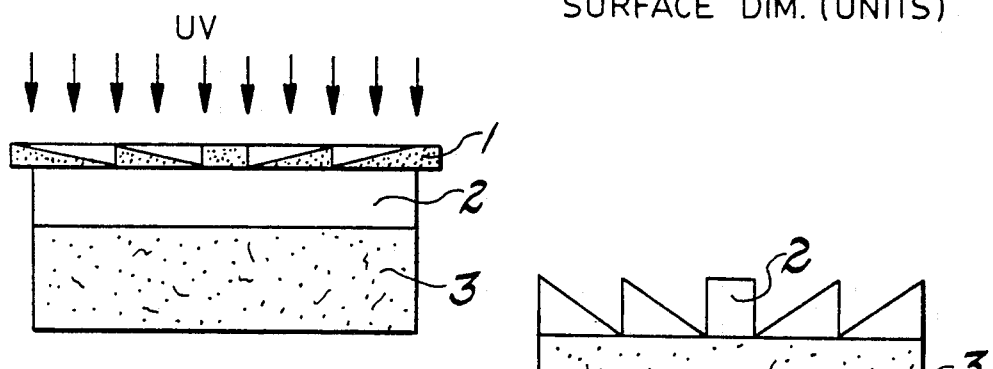
Fig. 4a
Fig. 4b

METHOD OF MANUFACTURING SURFACE RELIEF PATTERNS OF VARIABLE CROSS-SECTIONAL GEOMETRY

This application is a continuation of application serial no. 040,055, filed Apr. 20, 1987, now abandoned.

BACKGROUND OF THE INVENTION

1. Field of the Invention

This invention relates to a method of manufacturing surface relief pattern which are of specified and variable cross-sectional and surface geometry, in solid materials, and more particularly to methods of etching the surface of the solid through the use of selective exposure of a resist coating and subsequent bombardment of the resist and solid substrate with reactive ions. Such variable surface geometry is of particular use in the creation of diffraction type gratings, and particularly in the formation of blazed diffraction systems.

2. Description of the Prior Art

In recent years, there has been a substantial increase in the development of optical systems using optical elements having three-dimensional surface relief patterns. Because of relatively new interest in diffraction gratings with non-uniform geometries, efforts have been made to fabricate this type of grating, but with only limited success.

Fabrication has principally been based on photolithographic techniques using a standard photoresist material. Typically, the photoresist has been used as a recording medium for light which defines a light intensity pattern in the photoresist. A commonly used method is to expose the photoresist material to holographically interfering light, with subsequent development of the photoresist coating. A second method commonly used is to fabricate a so-called "binary" mask, which is a mask which is in some locations absolutely opaque to radiation, and in other locations, absolutely transmissive. This pattern is contact printed on the photoresist layer or holographically exposed on the photoresist layer. The photoresist material is then developed chemically, leaving a surface relief pattern in the photoresist which is directly related to the light intensity pattern allowed by the binary mask. Once the photoresist has been exposed and developed, it may be used as an integral part of the completed transmission medium, or can be used as a mask to transfer the pattern to the substrate using methods such as wet etching, ion milling or reactive ion etching.

As shown in FIG. 1, a binary mask contains a pattern of alternating areas, absolutely non-transmissive of radiation and absolutely transmissive of radiation. For many applications, a surface of variable cross section is preferable. In those cases, however, a high degree of variation in the transmission density of the mask is desired to transfer a similar surface relief pattern of continuously variable geometry to the substrate.

Referring now to FIG. 2, a sample or theoretical surface cross section is disclosed. In this example, it is useful to consider the percentage of light transmission in terms of visible light, to better understand the desired result. For example, at point A on the surface of a variable transmission density mask, the mask would be translucent, transmitting perhaps 80% of the available visible light. At point B, by way of further example, the mask would be absolutely opaque and non-transmissive of any visible light wavelengths. Points C and D are provided as samples of points between a pair of points disposed along the variable portion of a linear gradient in the sample mask. Point C, for example, shows a lesser degree, of slope than point D, indicating that the light transmissivity to visible radiation of the mask at point D is changing more rapidly in relation to the surface area of the mask than at point C.

None of the current methods of manufacturing of blazed surfaces or continuously variable surface relief patterns are adequate to produce such a continuously variable surface relief pattern in the substrate material, although such patterns have been successfully transferred to a photoresist coating ("blazed" is a term typically applied to diffraction gratings). In a blazed surface, the grooves in a diffraction grating are of a controlled shape, which give the diffraction grating unique reflection and refraction properties, typically, reflection of large percentages of incoming light into a particular order for a given wavelength. Because the typical photoresist thickness seldom exceeds two microns, there is a corresponding limitation in the depth of the relief pattern which can be created in the photoresist itself. While greater thicknesses of photoresist are attainable using newer techniques, as the thickness of the photoresist increases, likewise, difficulties in obtaining linearity in the desired surface pattern increase.

The use of holography light for exposure requires at least two coherent beams of light which are interfering. The interference pattern is dependent on a complex interference geometry and the resulting intensity of the interfering light pattern. Because the interference pattern is not fully controllable, it is impossible to form generalized surface relief patterns in the photoresist, without a source of coherent light. Moreover, because the pattern of interfering light is depth dependent, it is not possible to fully control the depth of the obtained surface relief pattern.

Referring now to FIG. 3, a previously known and tried method of solving the problem is presented. In an effort to approximate a blazed surface, binary masks have been used in succession, to progressively etch everincreasing areas of the substrate, through multiple applications and, developments of successive photoresist layers. This requires the fabrication of a multiple series of binary masks, and this requires numerous masking, exposing and fabrication steps. These steps consume substantial time and materials, and increase the possibility of error in the final product. The method generally requires the exposure of the surface with a first mask which contains a masking pattern whose features are defined by the width dimension W. Exposure of the substrate is made utilizing this mask, for a measured period of time. After which the photoresist is developed, the substrate etched, and the remaining unwanted resist removed without affecting the substrate. A second mask with a masking pattern width x is then prepared, to overlay precisely along the, previously exposed, substrate in relation to the first pattern in the substrate and the above steps are repeated. Successive masks of width y and z are likewise applied, the photoresist exposed, resulting in step like overall exposure of, the substrate and a subsequent step like pattern in the surface of the substrate. Of course, it can be readily seen that the sloped surface so created along points A, B, C and D on such substrate are merely an approximation of a smooth slope, with various undesirable transmission properties as well as the limitations outlined above.

Attempts to use variable optical density masks for exposing the photoresist have been attempted, on a limited basis. The attempts have been directed to storing optical images directly in the photoresist and then using the photoresist itself as the relief phase storage medium. However, the procedures to transfer an optical pattern, with its linear characteristics, to the underlying solid material substrate have not been attempted. Because of the inherent non-linear absorption characteristics of photoresist, it has been impossible to obtain precise surface relief pattern depths of more than one micron. Variable optical density masks are used to reproduce an image only, not a desired substrate pattern, and hence, the developing and exposing techniques have been unable to compensate for the inherent non-linear characteristics of the photoresist, particularly at large photoresist thicknesses.

Consequently, a need exists for the development of a simple, reliable method of manufacturing surface relief patterns of variable three-dimensional geometry in a solid material which will result in the ability to obtain a wider range of depths of relief in the surface, allow generalized surface relief patterns to be formed, while avoiding the errors which are inherent in the multiple binary masking techniques, all at reasonable cost and with predictable accuracy.

SUMMARY OF THE INVENTION

The present invention provides a method designed to satisfy the aforementioned needs. Manufacture of a desired surface, relief, pattern of specified and variable cross-section and variable surface geometry is achieved by compiling an algorithm for the proper exposure of a layer of radiation-sensitive resist material deposited on a solid substrate. The exposure data resulting from the application of this algorithm is applied to a system of variable radiation and variable masking to transfer the desired variable surface relief pattern to the radiation-sensitive resist material. The derived algorithm is a function of several factors, which compensate for the inherent nonlinear characteristics of the radiation-sensitive resist material, thereby overcoming the limitations of the linear characteristics of a standard optical pattern (for example, a transparency such as a photographic slide transparancy) as a mask. By exposing and subsequently developing the deposited radiation-sensitive resist material according to that algorithm, the solid substrate can then be subjected to etching techniques which allow the variable relief pattern of the developed radiation-sensitive resist layer to be transferred to the substrate itself, eliminating the radiation-sensitive resist layer partially or in its entirety and allowing for the creation of surface relief patterns of a depth greatly in excess of the thickness of the radiation-sensitive resist alone, and with infinitely variable cross-section.

Accordingly, the present invention relates to a method for manufacturing surface relief patterns in a solid material which are of specified and variable cross-sectional surface geometry, including the, operative steps of depositing a radiation-sensitive resist material on a solid substrate, selecting and applying variable radiation which is a function of the desired relief pattern, adjusted for the additional variables of the properties of the radiation-sensitive resist and, substrate material's, to irradiate the combined radiation-sensitive resist and substrate selectively, then chemically developing the radiation-sensitive resist layer, and ultimately etching the surface of the substrate and the radiation-sensitive resist with reactive ions to create the desired surface relief pattern. The invention may also include, the steps of coating the completed substrate with a single or multiple layer material film.

BRIEF DESCRIPTION OF THE DRAWINGS

FIG. 1 is a chart depicting the radiation transmission of a binary mask, shown as a percentage of radiation transmission, against an unspecified linear distance across the surface of the mask.

FIG. 2 is a similar chart, showing the radiation transmission of a variable transmission density mask, again showing a percentage of radiation transmission in relation to the linear surface dimension of the mask.

FIG. 3 depicts, in cross-section, the resulting three-dimensional surface of an approximately blazed grating, with multiple binary masking steps.

FIG. 4 is a simplified drawing of the principal steps involved in the transfer of a variable optical density pattern to a photoresist material applied to a solid substrate.

DETAILED DESCRIPTION OF THE PREFERRED EMBODIMENT OF THE INVENTION

Figure 5A:
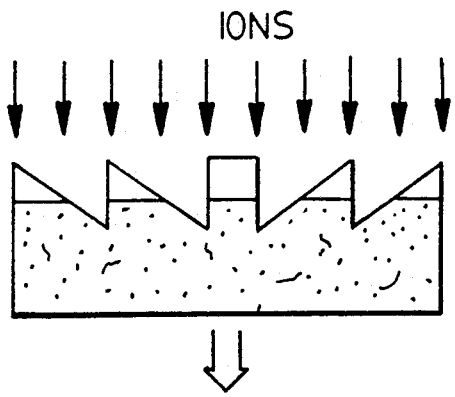
FIG. 5 is a similar diagram of the steps involved in the transfer of a surface relief pattern or a continuously variable slope to a layer of photoresist material, with the added steps of transferring said continuously variable pattern to a solid substrate, through the use of ion etching 5a, 5b and with the additional added step of applying a coating over the surface of the substrate 5c, following reactive ion etching.

The inventive method, in a preferred embodiment, actually commences with the determination of the actual geometry of the surface relief pattern sought to be achieved by the manufacturing process. Asn an example, the desired optical result of an optical device is determined, by tracing the path of the radiation energy rays in reverse to determine the type of variably surface geometry necessary to generate that pattern. Preliminarily, a determination is made of the chemical composition of the solid material to be etched, the chemical composition and thickness of the radiation-sensitive resist, the composition wavelength energy, and intensity of the radiation for exposing the radiation-sensitive resist, the time of exposure of the radiation-sensitive resist to radiation; and the character of the reactive ions to be used in the etching process. Applying these factors, a variable transmission density mask 1 is prepared which is compensated in its transmission density for the foregoing factors. In the alternative the raw data used, for the creation of the masking can be eliminated by using the variable transmission density mask to allow selective point-by-point exposure of the radiation-sensitive resist surface, therefore eliminating the need for a mask.

The radiation-sensitive resist is, by virtue of the exposure to radiation, sensitized in specific relation to the amount of radiation received. The preferred embodiment contemplates the use of either negative or positive radiation-sensitive resist. In a negative photoresist, the radiation-sensitive resist material is sensitized so as to create a pattern inverse to the desired substrate pattern. In the case of a positive photoresist, the photoresist pattern is sensitized in direct relation to the desired substrate pattern. The variable transmission density mask is then removed, and the sensitized photoresist coating is subjected to a liquid chemical development process. One method of chemical development involves immersion of the radiation-sensitive resist and the substrate in the developing chemical, which removes the radiation-sensitive resist material 2 in specific proportion to the amount of radiation which it has received in the exposure step. The chemical development process is followed by a fixation or rinsing process which terminates the development of the radiation-sensitive resist, and prevents further erosion of the radiation-sensitive resist material after removal from the chemical development bath. As an alternative method of development, the radiation-sensitive resist material may be developed by a gaseous medium. The resulting combined, solid material substrate and radiation--sensitive resist material bears, in the radiation-sensitive resist a variable geometry surface, relief pattern FIG. 4b; 2, 3. For optical exposure, the variable transmission density mask is preferably a photographic emulsion, however, for ͞ exposure of the radiation-sensitive resist and substrate, it is preferable to use a thin metal film mask material. In fact, a standard photographic emulsion is a type of metal film mask, except that the standard photographic emulsion consists of a deposit of metallic based compounds on a synthetic film surface.

Commercially available radiation-sensitive resist material may be deposited on the surface of the substrate to be treated by various methods. In the preferred embodiment, the radiation-sensitive resist is poured or dropped onto the surface of the substrate, and the combination of substrate and radiation-sensitive resist spun by suitable means, thereby distributing the photoresist on the surface of the substrate and obtaining a uniformly distributed layer of radiation-sensitive resist material on the substrate. Where, non-uniform, layers of radiation-sensitive resist are desired in the radiation-sensitive resist may be dipped into a liquid, bath of substrate material, and removed. The length of time of immersion and the rate of removal provide the appropriate variables for regulating the thickness and density of the radiation-sensitive resist at any point on the surface. Alternatively, the radiation-sensitive resist material can be sprayed onto the substrate in liquid form, by passing the photoresist through an atomizer or deposited from a gas phase.

Referring now to FIG. 4, a mask 1 is placed between the radiation-sensitive photoresist material 12 and the substrate material 3 and the radiation source, which, in this example, is ultraviolet light. The ultraviolet wavelengths normally light with wavelengths from 250 nanometer to 450 nanometer. Ultraviolet light is considered most suitable for the formulation of structures of surface details within the plane of the surface, of .5 microns or larger. When surface structures that have details within the plane of the surface of less than 0.5 microns are desired, it is generally preferable to use x-rays, ions or electrons for irradiation. Sources of ultraviolet light are typically arc lamps or lasers, whereas electrons and ions are generated, as a radiation source, via a commercially available generator of such radiation. The irradiating process for exposure of the radiation-sensitive resist takes place in a controlled environment from which all undesirable radiation sources are excluded. This is done to prevent spurious radiation from contaminating the exposure process.

Figure 5B:
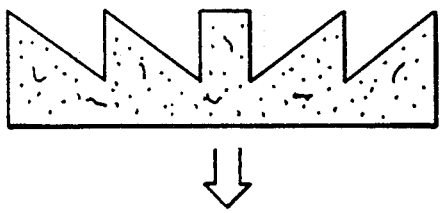
Figure 5C:
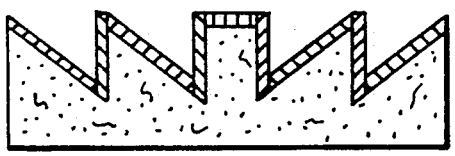
Figure 6:
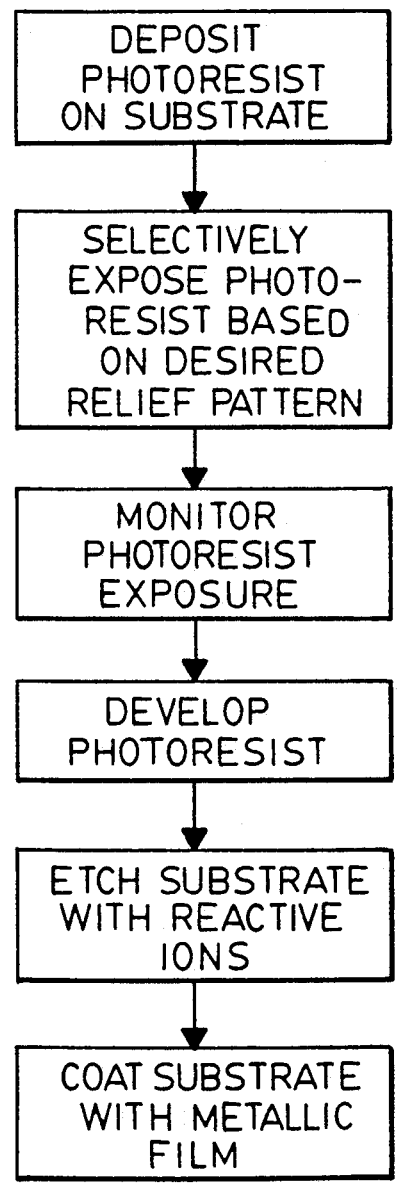
FIG. 6 is a block diagram showing the steps used in the current invention.

Referring next to FIG. 5, the combined photoresist and substrate material is exposed, to a highly, directional beam of reactive ions. As illustrated in FIG. 5a, which ions 4 react with the photoresist 2 as well as the substrate 3. The reactive ion beam is applied until the photoresist material has been appropriately eroded, resulting in an etched pattern in the substrate 3 which approximates the pattern in the variable transmission density mask, as corrected for photoresist and substrate variables, as shown in cross-section FIG. 5b. Thus, the desired surface relief pattern is transferred to the solid substrate material.

The combined exposure and development process is monitored to determine, after a timed exposure, the depth of the pattern at any given point on the substrate, and the density of the mask adjusted by empirical measurement to achieve the desired depth of cross section in relation to the thickness of the photoresist and measured time of exposure. Reactive ion etching of the combined photoresist and substrate typically involves placement of the coated substrate in the ion chamber, and the generation of reactive ions therein. However, an alternate method contemplates the creation of a reactive ion beam, which is then directed to a separate chamber in which the substrate and photoresist are located. The timing of the etching process is preferably achieved by directing an external source of detectable radiation onto the surface of the photoresist and substrate, and measuring the reflected or refracted radiation from said source, to monitor changes in the surface condition, by measuring the properties of the radiation as the surface condition changes. Alternately, a simple timing method can be used by establishing set times for etching. Preferably, the source of reactive ions is incident in a direction perpendicular to the plane of the substrate, but a source of reactive ions may be directed at an angle to the substrate to obtain different surface structures.

In an optional final step in, the process, ,the etched substrate can be coated with, a single or multiple layer material film 5 to obtain enhanced optical properties. This material film may be a metal film, such a gold, silver, aluminum, copper or tungsten, or it may be in the nature of a non-metallic dielectric coating such as an anti-reflective coating. Typically, these metallic coatings may be used based on each metal's individual specific properties to reflect or diffract specific wavelengths of light. Typically, silver, aluminum and gold coatings are most effective in reflection or diffraction of wavelengths of light in the near infrared to ultraviolet range, while copper and tungsten provide better performance in the millimeter to far infrared wavelengths.

Metallic films can be deposited on the completed surface through isolation of the substrate material in a vacuum chamber, together with a metal source. The source of metal is heated through various means inside the chamber, evaporating metal from the source which is then deposited on the substrate resulting in a thin metal film on the surface of the substrate within the same chamber. In addition, it is often advantageous to first deposit a thin layer of chromium on glass and similar substrates to improve adhesion of metal films.

With metallic substrates, another method of coating utilizes electrochemical means, although other chemical means of depositing metal films on the surface are known. Dielectric films, such as those used with anti-reflective coatings and filters, are typically non-metallic, and are usually made of insulator materials. Dielectric films may be applied by such techniques as sputtering, solgel processes, growth from a liquid melt, or chemical vapor deposition.

Although the method described herein as the preferred embodiment includes removal of the radiation-sensitive resist material in the ion etching process, complete removal of the radiation-sensitive resist material is, not necessary. It is possible to leave portions of the radiation-sensitive resist material in place to take advantage of the properties of the radiation-sensitive resist material and substrate combination, to ensure against over etching, or in situations where multiple radiation-sensitive resist materials are applied to obtain more compllex and varied surface relief patterns.

It is thought that the process for manufacturing variable geometry surface relief patterns will be understood from the foregoing description, and it is also apparent that various changes may be made in the method herein described without departing from the spirit and scope of the invention or sacrificing the advantages described herein, the above being merely a preferred embodiment thereof.

I claim:

1. A method of manufacturing in the surface of a solid substrate a three-dimensional surface relief pattern of desired variable cross-sectional geometry, comprising the steps of:
    (a) depositing on said surface of said substrate a uniform thickness layer of radiation-sensitive resist material;
    (b) determining a pattern of transmission density for each point of a mask of variable transmission density said transmission density for each point of said mask of variable transmission density determined based upon the desired variable cross-sectional geometry at a corresponding point of said surface of said substrate to compensate for the non-linear absorption characteristics of transferring said pattern to said resist material;
    (c) producing a mask of variable transmission density having said determined pattern of variable transmission density;
    (d) placing said mask between a source of radiation and said resist-covered substrate;
    (e) exposing said mask and said resist-covered substrate to radiation;
    (f) chemically developing said resist material, thereby removing a portion of said resist material and leaving remaining resist material corresponding to said pattern of variable transmission density; and
    (g) etching said surface of said substrate and said remaining resist material by bombarding said substrate and said remaining resist material with a directional beam of reactive ions until said remaining resist material has been removed and a portion of said substrate has been removed, thereby forming a three-dimensional surface relief pattern in said substrate corresponding to the pattern of said remaining resist material.

2. The method of manufacturing a three-dimensional surface relief pattern of desired variable cross-sectional geometry as claimed in claim 1, wherein:
    said step of determining said pattern of transmission density further includes compensating for the unequal etch rates of said substrate and said remaining resist material during said step of etching said surface of said substrate and said remaining resist material.

3. The method of manufacturing a three-dimensional surface relief pattern of desired variable cross-sectional geometry as claimed in claim 2, wherein:
    said compensating for the unequal etch rates of said step of determining said pattern of transmission density is based upon the composition of said resist material, the composition of said substrate, the depth of said surface relief pattern, the variable cross-sectional geometry of said surface relief pattern at various points, the wavelength of the radiation used for exposure of said resist material, and the nature of reactive ions to be used in etching substrate and said remaining resist material.

4. The method of manufacturing a three-dimensional surface relief pattern of desired variable cross-sectional geometry as claimed in claim 1, wherein:
    said resist material is a negative resist material;
    said step of determining said pattern of transmission density for each point of a mask of variable transmission density includes determining said pattern as the inverse of said desired variable cross-sectional geometry; and
    said step of chemically developing said resist material removes the portion of said resist material exposed to said radiation and leaves said remaining resist material not exposed to said radiation.

5. The method of manufacturing a three-dimensional surface relief pattern of desired variable cross-sectional geometry as claimed in claim 1, wherein:
    said resist material is a positive resist material;
    said step of determining said pattern of transmission density for each point of a mask of variable transmission density includes determining said pattern corresponding to said desired variable cross-sectional geometry; and
    said step of chemically developing said resist material removes the portion of said resist material not exposed to said radiation and leaves said remaining resist material exposed to said radiation.

6. The method of manufacturing a three-dimensional surface relief pattern of desired variable cross-sectional geometry as claimed in claim 1, further comprising the step of:
    (h) coating said etched substrate with at least one thin film of material.

7. The method of manufacturing a three-dimensional surface relief pattern of desired variable cross-sectional geometry as claimed in claim 6, wherein:
    said at least one thin film of material includes a thin film of a metal.

8. The method of manufacturing a three-dimensional surface relief pattern of desired variable cross-sectional geometry as claimed in claim 6, wherein:
    said at least one thin film of material includes a thin film of a non-metallic dielectric.

9. The method of manufacturing a three-dimensional surface relief pattern of desired variable cross-sectional geometry as claimed in claim 6, wherein:
    said at least one thin film of material includes a thin film of a semiconductor.

10. The method of manufacturing a three-dimensional surface relief pattern of desired variable cross-sectional geometry as claimed in claim 1, wherein:
    said step of determining said pattern of transmission density further includes determining a function of mask transmission density versus depth of etch in said substrate by repeatedly for each mask transmission density (i) depositing on said surface of a test substrate a uniform thickness layer of said radiation-sensitive resist material;

(ii) producing a mask of uniform fixed transmission density;

(ii) placing said mask between a source of radiation and said resist-covered test substrate;

(iv) exposing said mask and said resist-covered test substrate to radiation;

(v) chemically developing said resist material, thereby removing a portion of said resist material and leaving remaining resist material corresponding to said pattern of variable transmission density;

(vi) etching said surface of said test substrate and said remaining resist material by bombarding said test substrate and said remaining resist material with a directional beam of reactive ions until said remaining resist material has been removed and a portion of said test substrate has been removed;

(vii) measuring the depth of etch in said test substrate; and said step of determining said pattern of transmission density further includes determining said transmission density for each point of a mask of variable transmission density corresponding to said transmission density for said test substrate which produced a depth of etch equal to said desired variable cross-sectional geometry at a corresponding point of said surface of said substrate.

11. A method of manufacturing in the surface of a solid substrate a three-dimensional surface relief pattern of desired variable cross--sectional geometry, comprising the steps of:

(a) depositing on said surface of said substrate a uniform thickness layer of radiation-sensitive resist material;

(b) determining a pattern of exposure intensity for each point of said resist material, said exposure intensity for each point of said resist material determined based upon the desired variable cross-sectional geometry at a corresponding point of said surface of said substrate to compensate for the non-linear absorption characteristics of transferring said pattern to said resist material;

(c) exposing said resist-covered substrate to radiation having said pattern of exposure intensity;

(d) chemically developing said resist material, thereby removing a portion of said resist material and leaving remaining resist material corresponding to said pattern of exposure intensity; and (g) etching said surface of said substrate and said remaining resist material by bombarding said substrate and said remaining resist material with a directional beam of reactive ions until said remaining resist material has been removed and a portion of said substrate has been removed, thereby forming a three-dimensional surface relief pattern in said substrate corresponding to the pattern of said remaining resist material.

12. The method of manufacturing a three-dimensional surface relief pattern of desired variable cross-sectional geometry as claimed in claim 11, wherein:

said step of determining said pattern of exposure intensity further includes compensating for the unequal etch rates of said substrate and said remaining resist material during said step of etching said surface of said substrate and said remaining resist material.

13. The method of manufacturing a three-dimensional surface relief pattern of desired variable cross-sectional geometry as claimed in claim 12, wherein:

said compensating for the unequal etch rates of sad step of determining said pattern of exposure intensity is based upon the composition of said resist material, the composition of said substrate, the depth of said surface relief pattern, the variable cross--sectional geometry of said surface relief pattern at various points, the wavelength of the radiation used for exposure of said resist material, and the nature of reactive ions to be used in etching substrate and said remaining resist material.

14. The method of manufacturing at three-dimensional surface relief pattern of desired variable cross---sectional geometry as claimed inn claim 11, wherein:

said resist material is a negative resist material;

said step of determining said pattern of exposure intensity for each point of said resist material includes determining said pattern as the inverse of said desired variable cross-sectional geometry; and said step of chemically developing said resist material removes the portion of said resist material exposed to said radiation and leaves said remaining resist material not exposed to said radiation.

15. The method of manufacturing a three-dimensional surface relief pattern of desired variable cross-sectional geometry as claimed in claim 11, wherein:

said resist material is a positive rest material;

said step of determining said pattern of exposure intensity for each point of said resist material includes determining said pattern corresponding to said desired variable cross-sectional geometry; and said step of chemically developing said resist material removes the portion of said resist material not exposed to said radiation and leaves said remaining resist material exposed to said radiation.

16. The method of manufacturing a three-dimensional surface relief pattern of desired variable cross-sectional geometry as claimed in claim 11, further comprising the step of:

(h) coating said etched substrate with at least one thin film of material.

17. The method of manufacturing a three-dimensional surface relief pattern of desired variable cross-sectional geometry as claimed in claim 16, wherein:

said at least one thin film of material includes a thin film of a metal.

18. The method of manufacturing a three-dimensional surface relief pattern of desired variable cross-sectional geometry as claimed in claim 16, wherein:

said at least one thin film of material includes a thin film of a non-metallic dielectric.

19. The method of manufacturing a three-dimensional surface relief pattern of desired variable cross-sectional geometry as claimed inn claim 16, wherein:

said at least one thin film of material includes a thin film of a semiconductor.

20. In a method of manufacturing in the surface of a solid substrate a three-dimensional surface relief pattern of desired variable cross--sectional geometry including the steps of depositing a uniform thickness layer of radiation-sensitive resist material on the substrate, exposing the resist-covered substrate to a pattern of radiation, chemically developing the exposed resist material, and etching the surface of the substrate and the remaining resist material with a directional beam of reactive ions, the improvement comprising the step of:

determining the pattern of radiation exposure intensity for each point of said resist material based upon the desired variable cross-sectional geometry at a corresponding point of said surface of said substrate to compensate for the non-linear absorption characteristics of transferring the pattern to the resist material and to compensate for the unequal etch rates of the substrate and the resist material during etching.

* * * * *

UNITED STATES PATENT AND TRADEMARK OFFICE
CERTIFICATE OF CORRECTION

PATENT NO. : 5,004,673

DATED : April 2, 1991

INVENTOR(S) : Nickolas P. Vlannes

It is certified that error appears in the above-identified patent and that said Letters Patent is hereby corrected as shown below:

Column 2, line 57, "pattern width" should be --pattern of width--;

Column 2, line 59, "exposed, substrate" should be --exposed substrate--;

Column 2, line 62, "of," should be --of--;

Column 3, line 31, "surface, relief, pattern" should be --surface relief pattern--;

Column 3, line 59, "the, operative" should be --the operative--;

Column 3, line 64, "and, substrate" should be --and substrate--;

Column 4, line 2, "include, the" should be --include the--;

Column 4, line 39, "Asn" should be --As--;

UNITED STATES PATENT AND TRADEMARK OFFICE
CERTIFICATE OF CORRECTION

PATENT NO. : 5,004,673
DATED : April 2, 1991
INVENTOR(S) : Nickolas P. Vlannes

It is certified that error appears in the above-identified patent and that said Letters Patent is hereby corrected as shown below:

Column 4, line 41, "determined, by" should be --determined by--;

Column 4, line 54, "alternative the" should be --alternative, the--;

Column 4, line 54, "used," should be --used--;

Column 5, line 16, "combined, solid" should be --combined solid--;

Column 5, line 17, "radiation--sensitive" should be --radiation-sensitive--;

Column 5, line 18, "resist a" should be --resist, a--;

Column 5, line 19, "surface, relief" should be --surface relief--;

UNITED STATES PATENT AND TRADEMARK OFFICE
CERTIFICATE OF CORRECTION

PATENT NO. : 5,004,673
DATED : April 2, 1991
INVENTOR(S) : Nickolas P. Vlannes

It is certified that error appears in the above-identified patent and that said Letters Patent is hereby corrected as shown below:

Column 5, lines 38 to 41, "Where, non-uniform, layers of radiation-sensitive resist are desired in the radiation-sensitive resist may be dipped into a liquid, bath of substrate material, and removed." should be --Where non-uniform layers of radiation-sensitive resist are desired, or non-planar or large surfaces which do not permit spin distribution of the radiation-sensitive resist are desired, the substrate may be dipped into a liquid bath of radiation-sensitive resist material, and removed--;

Column 5, line 50, "photoresist" should be --resist--;

Column 5, line 50, "12" should be --2--;

Column 5, line 53, "wavelengths" should be --spectrum is--;

Column 5, line 56, "details" should be --details,--;

UNITED STATES PATENT AND TRADEMARK OFFICE
CERTIFICATE OF CORRECTION

PATENT NO. : 5,004,673
DATED : April 2, 1991
INVENTOR(S) : Nickolas P. Vlannes

It is certified that error appears in the above-identified patent and that said Letters Patent is hereby corrected as shown below:

Column 6, line 2, "exposed, to a highly, direc-" should be --exposed to a highly direc- --;

Column 6, line 4, "which ions 4" should be --ions 4--;

Column 6, line 38, "in, the process, , the" should be --in the process, the--;

Column 6, line 39, "with, a" should be --with a--;

Column 7, line 6, "is," should be --is--;

Column 7, line 31 to 32, "density said" should be --density, said--;

Column 9, line 35, "cross--sectional" should be --cross-sectional--;

Column 10, line 7, "sad" should be --said--;

UNITED STATES PATENT AND TRADEMARK OFFICE
CERTIFICATE OF CORRECTION

PATENT NO. : 5,004,673

DATED : April 2, 1991

INVENTOR(S) : Nickolas P. Vlannes

It is certified that error appears in the above-identified patent and that said Letters Patent is hereby corrected as shown below:

Column 10, line 12, "cross--sectional" should be --cross-sectional--;

Column 10, line 18, "cross--" should be --cross- --;

Column 10, line 19, "-sectional" should be --sectional--;

Column 10, line 19, "inn" should be --in--;

Column 10, line 32, "rest" should be --resist--;

Column 10, line 59, "inn" should be --in--;

Column 10, line 64, "cross--sectional" should be --cross-sectional--.

Signed and Sealed this

Twenty-ninth Day of September, 1992

Attest:

DOUGLAS B. COMER

Attesting Officer
Acting Commissioner of Patents and Trademarks